United States Patent
Sakamoto et al.

(10) Patent No.: US 10,437,150 B2
(45) Date of Patent: *Oct. 8, 2019

(54) COMPOSITION FOR FORMING RESIST UNDERLAYER FILM WITH REDUCED OUTGASSING

(75) Inventors: Rikimaru Sakamoto, Toyama (JP); Bangching Ho, Toyama (JP); Takafumi Endo, Toyama (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/131,474

(22) PCT Filed: Nov. 19, 2009

(86) PCT No.: PCT/JP2009/069615
§ 371 (c)(1),
(2), (4) Date: May 26, 2011

(87) PCT Pub. No.: WO2010/061774
PCT Pub. Date: Jun. 3, 2010

(65) Prior Publication Data
US 2011/0230058 A1 Sep. 22, 2011

(30) Foreign Application Priority Data
Nov. 27, 2008 (JP) .................. 2008-302555

(51) Int. Cl.
*G03F 7/09* (2006.01)

(52) U.S. Cl.
CPC .............. *G03F 7/091* (2013.01); *G03F 7/093* (2013.01)

(58) Field of Classification Search
CPC ....................................... G03F 7/091
See application file for complete search history.

(56) References Cited

U.S. PATENT DOCUMENTS

| | | | | |
|---|---|---|---|---|
| 5,989,776 A | * | 11/1999 | Felter et al. | 430/270.1 |
| 7,332,266 B2 | * | 2/2008 | Kishioka et al. | 430/512 |
| 7,425,399 B2 | * | 9/2008 | Kishioka et al. | 430/270.1 |
| 7,595,144 B2 | * | 9/2009 | Kishioka et al. | 430/311 |
| 7,790,356 B2 | * | 9/2010 | Kishioka et al. | 430/311 |
| 7,816,067 B2 | * | 10/2010 | Enomoto et al. | 430/270.1 |
| 8,257,910 B1 | * | 9/2012 | Guerrero | G03F 7/26 430/322 |
| 8,361,695 B2 | * | 1/2013 | Hiroi et al. | 430/271.1 |
| 2002/0102483 A1 | * | 8/2002 | Adams | G03F 7/091 430/30 |
| 2006/0153987 A1 | | 7/2006 | Kim et al. | |
| 2006/0234158 A1 | * | 10/2006 | Hatakeyama | G03F 7/094 430/270.1 |
| 2006/0290429 A1 | | 12/2006 | Kishioka et al. | |
| 2007/0238029 A1 | * | 10/2007 | Takei | C08F 220/28 430/5 |
| 2008/0038678 A1 | * | 2/2008 | Kishioka et al. | 430/327 |
| 2008/0138744 A1 | * | 6/2008 | Hatanaka | G03F 7/0392 430/319 |
| 2008/0305441 A1 | * | 12/2008 | Yoon | G03F 7/091 430/323 |
| 2009/0117493 A1 | * | 5/2009 | Kishioka | G03F 7/091 430/315 |
| 2009/0253076 A1 | * | 10/2009 | Sakaguchi | G03F 7/091 430/286.1 |
| 2009/0317740 A1 | * | 12/2009 | Hiroi | G03F 7/11 430/270.1 |

FOREIGN PATENT DOCUMENTS

| | | | | |
|---|---|---|---|---|
| CN | 1847274 A | * | 10/2006 | ........... G03F 7/11 |
| JP | A-2003-345027 | | 12/2003 | |
| JP | 2005114921 A | * | 4/2005 | |
| JP | A-2005-114921 | | 4/2005 | |
| JP | 2005156816 A | * | 6/2005 | |
| JP | A-2005-156816 | | 6/2005 | |
| JP | A-2006-508388 | | 3/2006 | |
| JP | A-2006-184471 | | 7/2006 | |
| JP | A-2007-171649 | | 7/2007 | |
| JP | WO 2007148627 A1 | * | 12/2007 | ........... G03F 7/11 |

(Continued)

OTHER PUBLICATIONS

Machine translation JP 2005-156816. Jun. 16, 2005.*

(Continued)

*Primary Examiner* — Cynthia H Kelly
*Assistant Examiner* — Alyssa L Cepluch
(74) *Attorney, Agent, or Firm* — Oliff PLC

(57) ABSTRACT

Underlayer films of high-energy radiation resists applied onto semiconductor substrates in a lithography process for producing semiconductor devices and that are used to prevent reflection, static electrification, and development defects and to suppress outgassing during the exposure of resist layers with high-energy radiation are prepared from compositions including a film component having an aromatic ring structure or a hetero ring structure. The film component having an aromatic ring structure or a hetero ring structure is contained at a proportion of 5 to 85% by mass. The film component may be a compound having an aromatic ring structure or a hetero ring structure, and the compound may be a polymer or a polymer precursor including a specific repeating unit. The aromatic ring may be a benzene ring or fused benzene ring, and the hetero ring structure may be triazinetrione ring.

1 Claim, No Drawings

(56) References Cited

FOREIGN PATENT DOCUMENTS

| JP | A-2008-065114 | | 3/2008 | |
|----|----|----|----|----|
| JP | A-2008-107817 | | 5/2008 | |
| JP | WO 2009008446 A1 | * | 1/2009 | ............ C08G 63/21 |
| WO | WO 2004/034148 A1 | | 4/2004 | |
| WO | WO-2005098542 A1 | * | 10/2005 | ........... C08G 61/122 |
| WO | WO-2005111724 A1 | * | 11/2005 | ............ G03F 7/0392 |
| WO | WO-2007023710 A1 | * | 3/2007 | ............ G03F 7/091 |
| WO | WO-2007036982 A1 | * | 4/2007 | ............ G03F 7/091 |
| WO | WO 2008/053974 A1 | | 5/2008 | |

OTHER PUBLICATIONS

Machine translation JP 2005-114921. Apr. 28, 2005.*
Partial written translation JP 2005-156816 paragraph [0025]. Jun. 16, 2005.*
Machine translation WO 2009/008446. Jan. 15, 2009.*
Machine translation CN 1847274. Oct. 18, 2006. (Year: 2006).*
Guerrero et al., "Organic Underlayers for EUV Lithography," *Journal of Photopolymer Science and Technology*, May 30, 2008, pp. 451-455, vol. 21, No. 3.
International Search Report issued in International Patent Application No. PCT/JP2009/069615 dated Mar. 2, 2010.

* cited by examiner

COMPOSITION FOR FORMING RESIST UNDERLAYER FILM WITH REDUCED OUTGASSING

TECHNICAL FIELD

The present invention relates to compositions for forming resist underlayer films. In particular, the present invention relates to underlayer films of high-energy radiation resists that are applied onto semiconductor substrates in a lithography process for producing semiconductor devices and that are used to prevent reflection, static electrification, and development defects and to suppress outgassing during the exposure of resist layers with high-energy radiation.

BACKGROUND ART

Conventionally, microfabrication has been carried out by lithography using photoresist compositions in the production of semiconductor devices. The microfabrication is a machining process in which a thin film of a photoresist composition is formed on a silicon wafer, active rays such as ultraviolet rays are radiated onto the film through a mask with a pattern of a semiconductor device followed by development, and the silicon wafer is etched using the obtained resist pattern as a protective film. However, in recent years, the integration density of semiconductor devices has been further increased and the active rays for use have a shorter wavelength and higher energy such as EUV rays (extreme ultraviolet rays, wavelength 13.5 nm), an electron beam, and X-rays, rather than i-rays (wavelength 365 nm), a KrF excimer laser (wavelength 248 nm), and an ArF excimer laser (wavelength 193 nm).

In the high-energy radiation resist film, a resist underlayer film used as an underlayer of the resist film has critical issues concerning adhesion to the resist, characteristics of resist shape, barrier performance for suppressing a passage of harmful substances between the underlayer (such as a substrate and an organic underlayer film) and the resist, performance of thin film formation (for example 30 nm or less), and characteristics of etching speed, as well as a decomposition product gas (out gas) that may be generated during the irradiation with high-energy radiation.

The exposure using such high-energy rays has a problem of contamination in a chamber by the outgassing due to the decomposition of a coated material.

Patent Documents 1, 2, and 3 disclose resist compositions that use an acid generator in an EUV resist to suppress outgassing for preventing such contamination. In Non-patent Document 1, there is a discussion concerning the reduction of outgassing in the resist underlayer film.

RELATED ART DOCUMENTS

Patent Documents

Patent Document 1: Japanese Patent Application Publication No. JP-A-2008-107817
Patent Document 2: Japanese Patent Application Publication No. JP-A-2008-065114
Patent Document 3: Japanese Patent Application Publication No. JP-A-2007-171649

Non-Patent Document

Non-patent Document 1: Journal of Photopolymer Science and Technology (Vol. 21, No. 3, 451-455, 2008)

DISCLOSURE OF THE INVENTION

Problem to be Solved by the Invention

It is an object of the present invention to provide: an underlayer film for a high-energy radiation resist that is used for an underlayer of a resist for high-energy radiation such as EUV, an electron beam, and X-rays, that has advantages of solving various problems during exposure to the high-energy radiation, such as reflection, static electrification, development defects, and outgassing, and that is especially excellent in outgassing suppression; a composition for forming an underlayer film that forms such underlayer films; and a method for forming a resist pattern using the composition for forming a resist underlayer film.

Means for Solving the Problem

The present invention provides, as a first aspect, a composition for forming an underlayer film of a high-energy radiation resist that includes a film component having an aromatic ring structure or a hetero ring structure, as a second aspect, the composition for forming an underlayer film of a high-energy radiation resist according to the first aspect, in which the film component having an aromatic ring structure or a hetero ring structure is contained in a film at a proportion of 5 to 85% by mass, as a third aspect, the composition for forming an underlayer film of a high-energy radiation resist according to the first aspect or the second aspect, in which the film component is a compound having an aromatic ring structure or a hetero ring structure, as a fourth aspect, the composition for forming an underlayer film of a high-energy radiation resist according to the third aspect, in which the compound is a polymer or a polymer precursor including a repeating unit selected from Formula (1) to Formula (4):

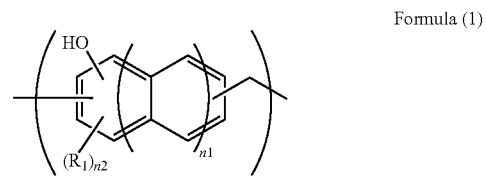

Formula (1)

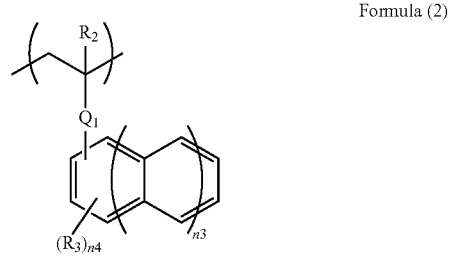

Formula (2)

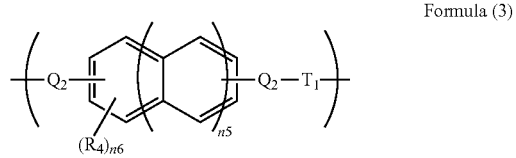

Formula (3)

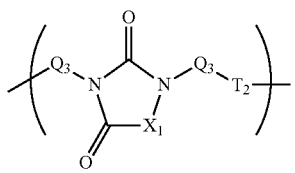

Formula (4)

[where each of n1, n3, and n5 is an integer of 0 to 2, and each of n2, n4, and n6 is an integer of 0 or more and an integer not more than a maximum number of substituents optionally substituted for a hydrogen atom on a corresponding ring. $R_1$ is an alkyl group, a halogen group, a nitro group, a cyano group, or an amino group, $R_2$ is a hydrogen atom or a methyl group, and each of $R_3$ and $R_4$ is a hydroxy group, an alkyl group, a halogen group, a nitro group, a cyano group, or an amino group. $Q_1$ is a direct bond, an oxygen atom, an oxycarbonyl group, an alkylene group, or an alkylene group substituted with a hydroxy group, each of $Q_2$s is independently a direct bond, an oxygen atom, or an oxycarbonyl group, each of $Q_3$s is independently a direct bond, an oxygen atom, an oxycarbonyl group, an alkylene group, or an alkylene group substituted with a hydroxy group, and each of $T_1$ and $T_2$ is a direct bond or a divalent linking group. $X_1$ is a structure selected from Formula (5) to Formula (7):

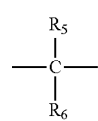

Formula (5)

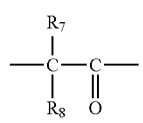

Formula (6)

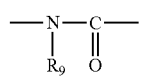

Formula (7)

(where each of $R_5$ to $R_8$ is a hydrogen atom, a $C_{1-6}$ alkyl group, a $C_{2-6}$ alkenyl group, a benzyl group, or a phenyl group, where the phenyl group is optionally substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group, $R_5$ and $R_6$ are optionally bonded to each other to form a $C_{3-6}$ ring, $R_7$ and $R_8$ are optionally bonded to each other to form a $C_{3-6}$ ring, $R_9$ is $Q_3$, a $C_{1-6}$ alkyl group, a $C_{2-6}$ alkenyl group, a benzyl group, or a phenyl group, and the phenyl group is optionally substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group)], as a fifth aspect, the composition for forming an underlayer film of a high-energy radiation resist according to the fourth aspect, in which the polymer or the polymer precursor including the repeating unit of Formula (1) includes a dimer of the repeating unit of Formula (1) at a content of 10% by mass or less and has a degree of distribution expressed by weight average molecular weight Mw/number average molecular weight Mn of 3.00 or less, as a sixth aspect, the composition for forming an underlayer film of a high-energy radiation resist according to the fourth aspect, in which the polymer or the polymer precursor including the repeating unit thus selected from Formula (2) to Formula (4) includes at least one ester linkage and an aromatic ring structure or a hetero ring structure, as a seventh aspect, the composition for forming an underlayer film of a high-energy radiation resist according to any one of the first to sixth aspects, in which the film component having an aromatic ring structure or a hetero ring structure is a cross-linking compound, as an eighth aspect, the composition for forming an underlayer film of a high-energy radiation resist according to any one of the first to seventh aspects, in which the aromatic ring is a benzene ring or a fused benzene ring, as a ninth aspect, the composition for forming an underlayer film of a high-energy radiation resist according to any one of the first to seventh aspects, in which the hetero ring is a triazinetrione ring, as a tenth aspect, the composition for forming an underlayer film of a high-energy radiation resist according to any one of the first to ninth aspects further including an acid catalyst, as an eleventh aspect, an underlayer film of a high-energy radiation resist obtained by applying the composition for forming an underlayer film of an EUV resist as described in any one of the first to tenth aspects onto a semiconductor substrate and baking the substrate, as a twelfth aspect, a method for producing a semiconductor device that includes: applying the composition for forming an underlayer film of a high-energy radiation resist as described in any one of the first to tenth aspects onto a semiconductor substrate and baking the substrate to form an underlayer film of a high-energy radiation resist; forming a high-energy radiation resist layer on the underlayer film of a high-energy radiation resist; exposing the resist formed as a layer on the underlayer film of a high-energy radiation resist to a high-energy ray; and developing the resist after the exposure, and as a thirteenth aspect, the invention according to any one of the first to twelfth aspects, in which the high-energy ray is an EUV ray.

Effects of the Invention

The underlayer film for a high-energy radiation resist of the present invention, the composition for forming an underlayer film that forms the underlayer film, and the method for forming a resist pattern using them have advantages in solving various problems such as reflection, static electrification, development defects, and outgassing during the exposure to high-energy rays such as EUV, an electron beam, and X-rays, especially have an excellent advantage in suppressing outgassing, and can suppress the amount of outgassing to $1.00 \times 10^{14}$ or less (number of molecule/cm$^2$/s).

BEST MODES FOR CARRYING OUT THE INVENTION

The composition for forming an underlayer film of a high-energy radiation resist of the present invention includes an aromatic ring structure or a hetero ring structure for a film component.

The aromatic ring or hetero ring structure may be included in the film in any form. However, in order to prevent volatilization of molecules having low molecular weight, the aromatic ring structure, the hetero ring structure, or a combination of the aromatic ring structure and the hetero ring structure is desirably fixed in the film as the film component. For example, it is desirable that such structure is a component for composing a polymer or a component of a cross-linking compound for cross-linking polymers, to form the film, and is consequently fixed in a cured film. Such component preferably has a certain content ratio in a solid content of the film for the suppression of outgassing.

The content of the film component of the aromatic ring structure or the hetero ring structure may be 5 to 90% by mass, 5 to 85% by mass, 20 to 85% by mass, or 50 to 85% by mass, in the film. The content of the aromatic ring structure or the hetero ring structure can be calculated, for example, based on benzene, naphthalene, anthracene, or cyanuric acid for a benzene ring, a naphthalene ring, an anthracene ring, or a triazinetrione ring, respectively.

The composition for forming an underlayer film of a high-energy radiation resist of the present invention includes a compound having the aromatic ring structure or the hetero ring structure and a solvent. The composition may further include optional components such as a cross-linking compound, a cross-linking catalyst, an acid generator, and a surfactant.

The composition for forming an underlayer film of a high-energy radiation resist of the present invention includes a solid content at, for example, 0.5 to 50% by mass, 1 to 30% by mass, or 1 to 25% by mass. Here, the solid content is a residue that is obtained by removing a solvent component from the whole component of the composition for forming an underlayer film of a high-energy radiation resist. The proportion of a compound having the aromatic ring structure or the hetero ring structure in the solid content is 50% by mass or more, and may be, for example, 50 to 100% by mass, 50 to 99% by mass, 50 to 95% by mass, or 60 to 90% by mass.

When the film component is included as a compound having the aromatic ring structure or the hetero ring structure, the compound is a polymer, a polymer precursor, a cross-linking compound for cross-linking polymers, or a combination of them.

The polymer precursor and the cross-linking compound for cross-linking polymers are polymer components in the film.

The polymer, the polymer precursor, and the cross-linking agent for cross-linking polymers preferably have at least one cross-linkable group in the polymer or the polymer precursor. The cross-linkable group is a hydroxy group, an epoxy group, a vinyl group, or the like.

Examples of the polymer include polymers including a repeating unit selected from Formula (1) to Formula (4).

In each formula, each of n1, n3, and n5 is an integer of 0 to 2, and each of n2, n4, and n6 is an integer of 0 or more and an integer not more than the maximum number of substituents capable of being substituted for a hydrogen atom on a corresponding ring. $R_1$ is an alkyl group, a halogen group, a nitro group, a cyano group, or an amino group, $R_2$ is a hydrogen atom or a methyl group, and each of $R_3$ and $R_4$ is a hydroxy group, an alkyl group, a halogen group, a nitro group, a cyano group, or an amino group. Each of $Q_1$s independently a direct bond, an oxygen atom, an oxycarbonyl group, an alkylene group, or an alkylene group substituted with a hydroxy group, each of $Q_2$s is independently a direct bond, an oxygen atom, or an oxycarbonyl group, each of $Q_3$s is independently a direct bond, an oxygen atom, an oxycarbonyl group, an alkylene group, or an alkylene group substituted with a hydroxy group, and each of $T_1$ and $T_2$ is a direct bond or a divalent linking group. $X_1$ is a structure selected from Formula (5) to Formula (7). Each of $R_5$ to $R_8$ is a hydrogen atom, a $C_{1-6}$ alkyl group, a $C_{2-6}$ alkenyl group, a benzyl group, or a phenyl group, where the phenyl group may be substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group, $R_5$ and $R_6$ may be bonded to each other to form a $C_{3-6}$ ring, and $R_7$ and $R_8$ may be bonded to each other to form a $C_{3-6}$ ring. $R_9$ is $Q_3$, a $C_{1-6}$ alkyl group, a $C_{3-6}$ alkenyl group, a benzyl group, or a phenyl group, and the phenyl group may be substituted with a group selected from a group consisting of a $C_{1-6}$ alkyl group, a halogen atom, a $C_{1-6}$ alkoxy group, a nitro group, a cyano group, a hydroxy group, and a $C_{1-6}$ alkylthio group. When $R_9$ is $Q_3$, a three-dimensional structure may be formed. $Q_3$ and $T_2$ at a terminal may be end-capped with a compound having an aromatic ring such as a phenyl group, a naphthyl group, and an anthryl group.

n2 is an integer of 0 to 3 when n1 is 0, is an integer of 0 to 5 when n1 is 1, and is an integer of 0 to 7 when n1 is 2. n4 is an integer of 0 to 5 when n3 is 0, is an integer of 0 to 7 when n3 is 1, and is an integer of 0 to 9 when n3 is 2. n6 is an integer of 0 to 4 when n5 is 0, is an integer of 0 to 6 when n5 is 1, and is an integer of 0 to 8 when n5 is 2.

The alkyl group is a $C_{1-6}$ alkyl group. Examples of such alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and 2-ethyl-3-methyl-cyclopropyl group.

Examples of the halogen group include fluorine, chlorine, bromine, and iodine.

The alkylene group is a $C_{1-6}$ alkylene group and is a divalent organic group corresponding to the alkyl group. Examples of such alkylene group include a methylene group, an ethylene group, an n-propylene group, an isopropylene group, a cyclopropylene group, an n-butylene group, an isobutylene group, an s-butylene group, a t-butylene group, a cyclobutylene group, a 1-methyl-cyclopropylene group, a 2-methyl-cyclopropylene group, an n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, an n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, and 2-ethyl-3-methyl-cyclopropylene group.

The alkenyl group is a $C_{2-6}$ alkenyl group. Examples of such alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and 3-cyclohexenyl group.

The alkoxy group is a $C_{1-6}$ alkoxy group. Examples of such alkoxy group include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

The polymer or the polymer precursor including the repeating unit of Formula (1) is a novolac polymer or a novolac polymer precursor. Examples of such compound include novolac polymers such as a phenol novolac, a naphthol novolac, and an anthrol novolac.

The novolac polymer can be obtained by condensation reaction of compounds such as phenol, naphthol, and anthrol with aldehydes. Examples of the aldehydes include saturated aliphatic aldehydes such as formaldehyde, paraformaldehyde, acetaldehyde, and propylaldehyde; unsaturated aliphatic aldehydes such as acrolein and methacrolein; heterocyclic aldehydes such as furfural; and aromatic aldehydes such as benzaldehyde, 1-naphthaldehyde, and 9-anthraldehyde. Formaldehyde or paraformaldehyde is preferable. Such aldehydes may be used alone or as a mixture of two or more of them. Such aldehyde may be used in a proportion of 1 to 1000 part(s) by weight and preferably 5 to 500 parts by weight, based on 100 parts by weight of an alcohol.

The novolac polymer used in the present invention preferably contains a highly volatile component having a low molecular weight in a small amount. Such small amount of a low molecular weight component reduces a volatile component as well as suppresses the decomposition by high-energy radiation due to expected uniform curing. For example, a usable novolac polymer contains a dimer at a content of 10% by mass or less, preferably 5% by mass or less, and even more preferably 1.5% by mass or less, in the novolac polymer. Furthermore, the polymer has a degree of distribution expressed by weight average molecular weight Mw/number average molecular weight Mn of 3.00 or less and preferably 1.00 to 2.00.

A resist underlayer film formed from the composition for forming a resist underlayer film that includes the novolac polymer or the novolac polymer precursor having such characteristics as an aromatic ring structure obtains high rigidity, low viscosity, and anti-cracking properties and furthermore can reduce outgassing.

For example, a resist underlayer film using a phenol novolac resin that has a dimer content of a dozen or so percent and a degree of distribution of 3.00 or more is decomposed to cause outgassing during the exposure to high-energy rays, but a resist underlayer film using a phenol novolac polymer that has the dimer content and the degree of distribution each described above largely reduces the amount of outgassing.

The polymer or the polymer precursor including the repeating unit structure of Formula (1) is shown below.

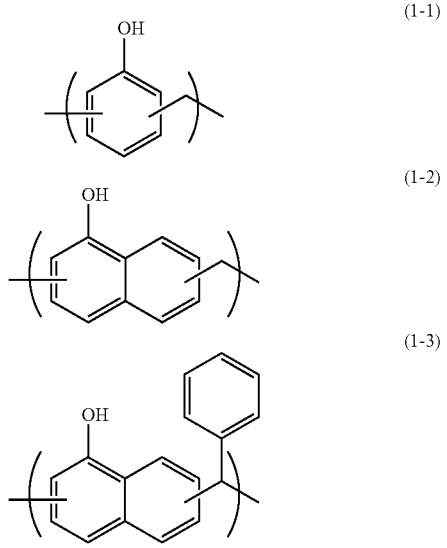

(1-1)

(1-2)

(1-3)

The polymer or the polymer precursor including the repeating unit of Formula (2) is a vinyl polymer or a vinyl polymer precursor. The polymer or the polymer precursor in which $Q_1$ is a direct bond can be obtained by polymerization by a method of, for example, radical polymerization, cationic polymerization, and anionic polymerization, of a vinyl monomer such as styrene, hydroxystyrene, vinylnaphthalene, hydroxyvinylnaphthalene, vinylanthracene, and hydroxyvinylanthracene. A vinyl monomer or a polymer of such monomer may be integrated with an aromatic group by any reaction. The polymer or the polymer precursor in which $Q_1$ is an oxygen atom or a combination of an oxygen atom and an alkylene group can be obtained, for example, by a reaction of a vinyl monomer having a hydroxy group or a polymer of such monomer with an aromatic compound having a hydroxy group, such as phenol, naphthol, and anthrol. The polymer or the polymer precursor in which $Q_1$ is an oxycarbonyl group is, for example, a compound in which a vinyl monomer or a polymer of such monomer is bonded to an aromatic compound through an ester linkage. One of the vinyl monomer or the polymer of such monomer and the aromatic compound is an alcohol, and the other is a carboxylic acid. The polymer or the polymer precursor in which $Q_1$ is alkylene substituted with hydroxy can be obtained, for example, by a reaction of a vinyl monomer having an epoxy group or a polymer of such monomer with an aromatic compound having a hydroxy group or a carboxy group. For example, such polymer or polymer precursor can be obtained by a reaction of glycidyl(meth)acrylate and naphthol or anthracene carboxylic acid.

The polymer or the polymer precursor including the repeating unit of Formula (2) preferably has at least one ester linkage and an aromatic ring structure in the polymer or the polymer precursor. A formed film having a repetition of the ester linkage and the aromatic ring structure can suppress decomposition due to the irradiation of high-energy rays to suppress outgassing. The ester linkage is on a side chain and may be on side chains of all repeating units or some repeating units.

A monomer that forms the polymer or the polymer precursor including the repeating unit of Formula (2) may form a copolymer with another polymerizable vinyl compound. Examples of the polymerizable vinyl compound include acrylic acid esters, acrylamides, methacrylic acid esters, methacrylamides, allyl compounds, vinyl ethers, vinyl esters, and crotonic acid esters. Examples of the acrylic acid esters include an alkyl acrylate having a $C_{1-10}$ alkyl group.

Examples of the methacrylic acid esters include an alkyl methacrylate having a $C_{1-10}$ alkyl group.

Examples of the acrylamides include acrylamide, an N-alkylacrylamide, an N-arylacrylamide, an N,N-dialkylacrylamide, an N,N-diarylacrylamide, N-methyl-N-phenylacrylamide, and N-2-acetamideethyl-N-acetylacrylamide.

Examples of the methacrylamides include methacrylamide, an N-alkylmethacrylamide, an N-arylmethacrylamide, an N,N-dialkylmethacrylamide, an N,N-diarylmethacrylamide, N-methyl-N-phenylmethacrylamide, and N-ethyl-N-phenylmethacrylamide.

Examples of the vinyl ethers include an alkyl vinyl ether and a vinyl aryl ether.

Examples of the vinyl esters include vinyl butyrate, vinyl isobutyrate, and vinyl trimethylacetate. Examples of the crotonic acid esters include alkyl crotonates such as butyl crotonate, hexyl crotonate, and glycerin monocrotonate.

Furthermore, examples thereof include dialkyl itaconates, dialkyl esters or monoalkyl esters of maleic acid or fumaric acid, crotonic acid, itaconic acid, maleic anhydride, lactones, acrylonitrile, methacrylonitrile, and maleilonitrile. The polymer or the polymer precursor including the repeating unit structure of Formula (2) is shown below.

Formula (2-1)

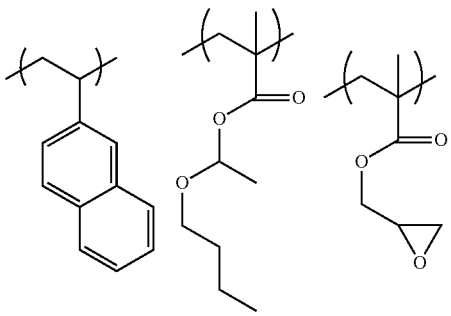

Formula (2-2)

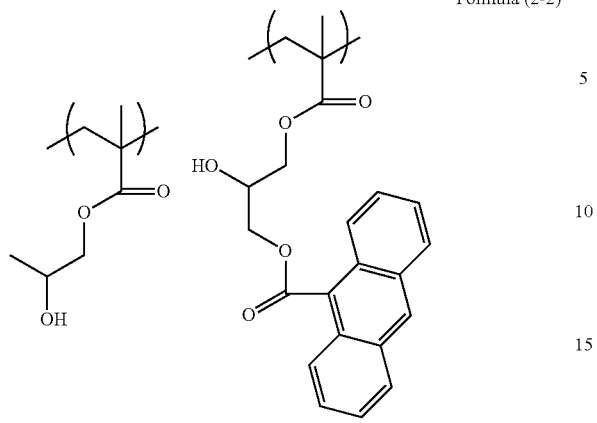

The polymer or the polymer precursor including the repeating unit of Formula (3) in which $Q_2$ is an oxygen atom and $T_1$ is a divalent linking group gives a polyether compound by a reaction of aromatic compounds having a hydroxy group to each other. The polymer or the polymer precursor in which $Q_2$ is an oxycarbonyl group and $T_1$ is a divalent linking group gives a polyester compound. The polymer or the polymer precursor in which $Q_2$ is an oxygen atom or an oxycarbonyl group and $T_1$ is a compound including an alkylene group substituted with a hydroxy group is a reaction product of a compound including a hydroxy group or a carboxy group and an epoxy compound. In this case, one of the aromatic compound and the compound having a divalent linking group of $T_1$ is the compound including a hydroxy group or a carboxy group and the other is the epoxy compound.

The polymer or the polymer precursor including the repeating unit of Formula (3) preferably has at least one ester linkage and an aromatic ring structure in the polymer or the polymer precursor. A formed film having a repetition of the ester linkage and the aromatic ring structure can suppress decomposition due to the irradiation of high-energy rays to suppress outgassing. The ester linkage is on the main chain or a side chain and may be on side chains of all repeating units or some repeating units.

The polymer or the polymer precursor including the repeating unit structure of Formula (3) is shown below.

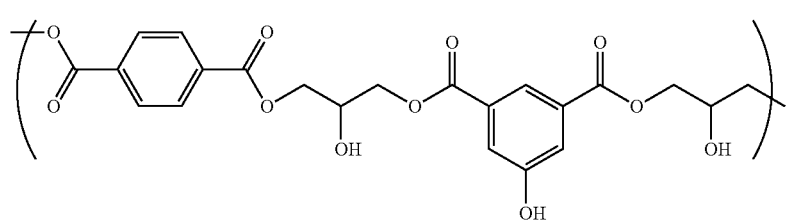

Formula (3-1)

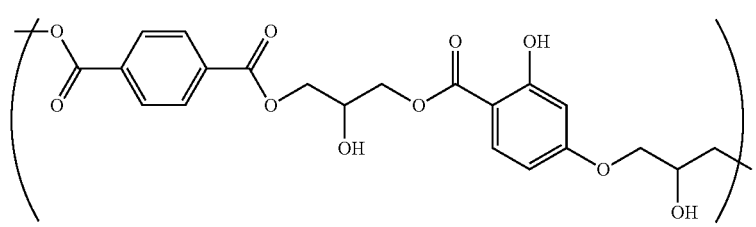

Formula (3-2)

The polymer or the polymer precursor including the repeating unit of Formula (4) can form a polymer by a reaction of a hydrogen atom on a nitrogen atom with a diepoxy compound. Alternatively, a glycidyl group on a nitrogen atom is reacted with a dialcohol compound or a dicarboxylic acid compound to form a polymer or a polymer precursor. The polymer precursor forms a polymer through a cross-linkable group in a film.

The polymer or the polymer precursor including the repeating unit of Formula (4) preferably has at least one ester linkage and a hetero ring structure in the polymer or the polymer precursor. A formed film having a repetition of the ester linkage and the hetero ring structure can suppress decomposition due to the irradiation of high-energy rays to suppress outgassing. The ester linkage is on the main chain or a side chain and may be on side chains of all repeating units or some repeating units.

The polymer or the polymer precursor including the repeating unit structure of Formula (4) is shown below.

Formula (4-1)

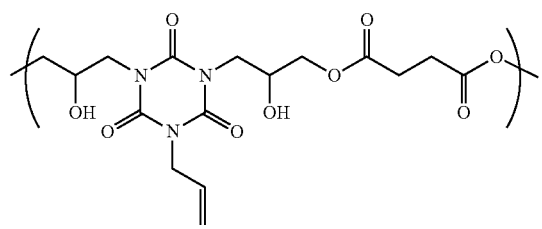

Formula (4-2)

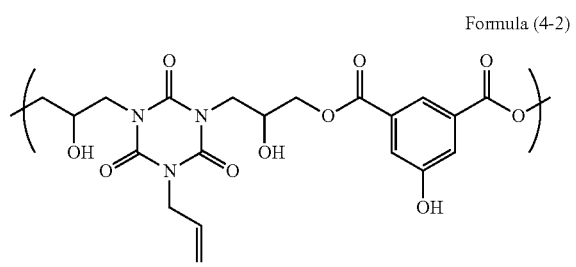

Formula (4-3)

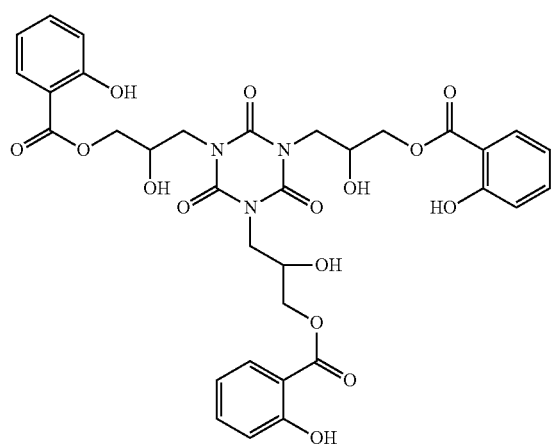

Formula (4-4)

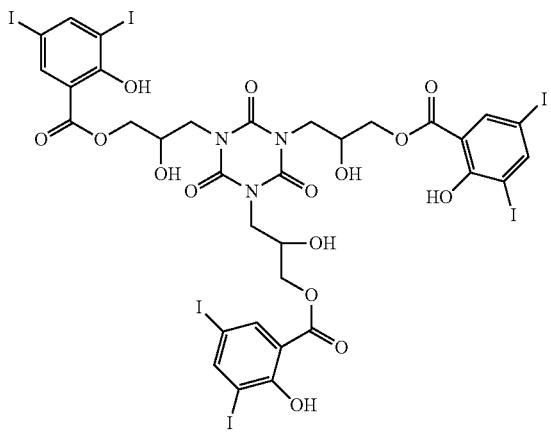

A compound including the repeating unit selected from Formula (1) to Formula (4) may be used as a polymer having a weight average molecular weight of 5,000 to 500,000 or may be used as a polymer precursor or a cross-linking compound having a weight average molecular weight of 500 to 5,000.

In the present invention, another cross-linking agent may be included in addition to or in place of the cross-linking compound. A cross-linking compound having at least two cross-linkable groups is preferably used for such cross-linking agent. Examples of such cross-linking compound include a melamine compound and a substituted urea compound each having a cross-linkable substituent such as a methylol group and a methoxymethyl group. Specific examples of such compound include methoxymethylated glycolurils and methoxymethylated melamines such as tetramethoxymethyl glycoluril, tetrabutoxymethyl glycoluril, and hexamethoxymethylmelamine. Additional examples include tetramethoxymethylurea and tetrabutoxymethylurea. The content of such cross-linking agent is, for example, 1 to 50% by mass or 10 to 40% by mass in the solid content.

The composition for forming an underlayer film of a high-energy radiation resist of the present invention may include an acid compound. Examples of the acid compound include sulfonic acid compounds such as p-toluenesulfonic acid, trifluoromethanesulfonic acid, and pyridinium-p-toluene sulfonate; and carboxylic acid compounds such as salicylic acid, sulfosalicylic acid, citric acid, benzoic acid, and hydroxybenzoic acid. Other examples of the acid compound include acid generators that generate an acid by heat or light, such as 2,4,4,6-tetrabromocyclohexadienone, benzoin tosylate, 2-nitrobenzyl tosylate, 2,4-dinitrobenzyl p-trifluoromethylbenzenesulfonate, phenyl-bis(trichloromethyl)-s-triazine, and N-hydroxysuccinimide trifluoromethanesulfonate. Still other examples of the acid compound include iodonium salt type-acid generators such as diphenyliodonium hexafluorophosphate, diphenyliodonium trifluoromethanesulfonate, and bis(4-tert-butylphenyl) iodonium trifluoromethanesulfonate; and sulfonium salt type-acid generators such as triphenylsulfonium hexafluoroantimonate and triphenylsulfonium trifluoromethanesulfonate. Preferably used acid compounds are sulfonic acid compounds, iodonium salt type-acid generators, and sulfonium salt type-acid generators. Such acid compounds may be used singly or in combination of two or more of them.

The content of the acid compound is, for example, 0.1 to 10% by mass or 0.1 to 5% by mass in the solid content.

Examples of rheology control agents include phthalic acid compounds such as dimethyl phthalate, diethyl phthalate, diisobutyl phthalate, dihexyl phthalate, and butyl isodecyl phthalate; adipic acid compounds such as di-n-butyl adipate, diisobutyl adipate, diisooctyl adipate, and octyldecyl adipate; maleic acid compounds such as di-n-butyl maleate, diethyl maleate, and dinonyl maleate; oleic acid compounds such as methyl oleate, butyl oleate, and tetrahydrofurfuryl oleate; and stearic acid compounds such as n-butyl stearate and glyceryl stearate. The amount used of the rheology control agent is, for example, 0.001 to 10% by mass in the solid content.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene.polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants including trade name EFTOP EF301, EF303, and EF352 (manufactured by Tohkem Products Corp.), trade name MEGAFAC F171, F173, R-08, and R-30 (manufactured by Dainippon Ink and Chemicals, Inc.), Fluorad FC430 and FC431 (manufactured by Sumitomo 3M Ltd.), trade name AsahiGuard AG710 and Surflon S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.). Such surfactants may be used singly or in combination of two or more of them. The amount used of the surfactant is, for example, 0.0001 to 5% by mass in the solid content.

For the solvent used in the composition for forming an underlayer film of a high-energy radiation resist of the present invention, any solvent may be used without limitation as long as the solvent can dissolve the solid contents. Examples of such solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. Such solvents are used singly or in combination of two or more of them. Such solvents may be used in combination with a high-boiling solvent such as propylene glycol monobutyl ether and propylene glycol monobutyl ether acetate.

Onto a semiconductor substrate (for example, a silicon/silicon dioxide coated substrate, a silicon nitride substrate, a glass substrate, and an ITO substrate), the composition for forming an underlayer film of a high-energy radiation resist of the present invention is applied by a suitable coating method using a spinner, a coater, or the like, followed by baking the coated substrate, to form an underlayer film of a high-energy radiation resist.

The baking condition is determined by suitably selecting from a baking temperature ranging from 80° C. to 250° C. and a baking time ranging from 0.3 to 60 minutes. Preferably, the baking temperature is 130° C. to 250° C. and the baking time is 0.5 to 5 minutes. The formed underlayer film of a high-energy radiation resist has a film thickness of, for example, 0.01 to 3.0 µm, and preferably, for example, 0.01 to 1.0 µm, 0.01 to 0.5 µm, or 0.01 to 0.03 µm.

Next, on the underlayer film of a high-energy radiation resist, a layer of a high-energy radiation resist such as an EUV resist is formed. The formation of the high-energy radiation resist layer may be performed by a well-known method, that is, by application of a high-energy radiation resist composition solution onto the underlayer film followed by baking.

Examples of the EUV resist include resist compositions using PMMA (polymethyl methacrylate), polyhydroxystyrene, a phenol resin, and the like.

Next, the semiconductor substrate coated with the resist is exposed through a predetermined mask. The exposure may employ EUV rays (13.5 nm), electron beams, X-rays, or the like. After the exposure, post exposure bake (PEB) may be carried out as necessary. The baking condition after the exposure is determined by suitably selecting from a heating temperature ranging from 70° C. to 150° C. and a heating time ranging from 0.3 to 10 minutes.

Next, the substrate after the exposure is developed with a developer. Examples of the developer include alkaline aqueous solutions including aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Such developers may include a surfactant and the like. The development condition is determined by suitably selecting from a development temperature ranging form 5 to 50° C. and a development time ranging from 10 to 300 seconds.

Then, the resist underlayer film is removed and the semiconductor substrate is processed, using the photoresist pattern formed in this way as the protective film. The removal of the resist underlayer film is performed with a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, and chlorine trifluoride.

Before the formation of the resist underlayer film of the present invention on a semiconductor substrate, a planarization film or a gap filler layer may be formed. For a semiconductor substrate having a large step or hole, the planarization film or the gap filler layer is preferably formed.

EXAMPLES

Synthesis Example 1

In 34.10 g of propylene glycol monomethyl ether, 5.00 g of monoallyldiglycidylisocyanuric acid (manufactured by Shikoku Chemicals Corporation), 3.32 g of 5-hydroxy-isophthalic acid, and 0.21 g of benzyltriethylammonium chloride were dissolved, and then the whole was reacted at 130° C. for 4 hours to give a polymer compound solution.

The obtained polymer compound corresponded to Formula (4-2) and had a weight average molecular weight of 17,000 in terms of standard polystyrene. The obtained polymer contained a triazinetrione ring and a benzene ring at a total content of 69% by mass in terms of cyanuric acid and in terms of benzene ring, respectively.

Synthesis Example 2

In 204.50 g of propylene glycol monomethyl ether, 11.00 g of tris(2,3-epoxypropyl)isocyanuric acid (Nissan Chemical Industries, Ltd., trade name TEPIC), 39.50 g of 3,5-diiodosalicylic acid, and 0.63 g of benzyltriethylammonium chloride were dissolved, and then the whole was reacted at 130° C. for 4 hours to give a polymer compound solution. The obtained polymer compound corresponded to Formula (4-4) and had a weight average molecular weight of 1,200 in terms of standard polystyrene. The obtained polymer contained a triazinetrione ring and a benzene ring at a total content of 27% by mass in terms of cyanuric acid and in terms of benzene ring, respectively.

Synthesis Example 3

A solution of 16.00 g of 2-vinylnaphthalene, 2.00 g of glycidyl methacrylate, and 2.00 g of 1-butoxyethyl methacrylate dissolved in 60.8 g of cyclohexanone was heated to 80° C. To the solution, a solution of 0.20 g of azobisisobutyronitrile dissolved in 20 g of cyclohexanone was slowly added. After the completion of the addition, the whole was reacted for 24 hours at 80° C. to give a polymer compound solution. The obtained polymer compound corresponded to Formula (2-1) and had a weight average molecular weight of 6,000 in terms of standard polystyrene. The obtained polymer contained a naphthalene ring at a content of 79% by mass in terms of naphthalene.

Synthesis Example 4

A solution of 39.00 g of hydroxypropyl methacrylate and 21.00 g of glycidyl methacrylate dissolved in 211.00 g propylene glycol monomethyl ether was heated to 80° C. To the solution, a solution of 0.60 g of azobisisobutyronitrile dissolved in 30 g of propylene glycol monomethyl ether was slowly added. After the completion of the addition, the whole was reacted for 24 hours at 80° C. to give a polymer compound solution. The obtained polymer compound had a weight average molecular weight of 50,000 in terms of standard polystyrene.

To 100.00 g of the obtained polymer solution, 10 g of 9-anthracene carboxylic acid and 0.30 g of benzyltriethylammonium chloride were added, and the whole was reacted at 130° C. for 24 hours to give a polymer compound solution that corresponded to Formula (2-2). The obtained polymer contained an anthracene ring at a content of 10% by mass in terms of anthracene.

Synthesis Example 5

In 59.90 g of propylene glycol monomethyl ether, 10.00 g of monoallyldiglycidyl isocyanuric acid (manufactured by Shikoku Chemicals Corporation), 4.30 g of succinic acid, and 0.68 g of ethyltriphenylphosphonium bromide were dissolved, and then the whole was reacted at 130° C. for 4 hours to give a polymer compound solution. The obtained polymer compound corresponded to Formula (4-1) and had a weight average molecular weight of 4,300 in terms of standard polystyrene. The obtained polymer contained a triazinetrione ring at a content of 61% by mass in terms of cyanuric acid.

Synthesis Example 6

In 70.95 g of propylene glycol monomethyl ether, 7.50 g of tris(2,3-epoxypropyl)isocyanuric acid (Nissan Chemical Industries, Ltd., product name TEPIC), 9.54 g of salicylic acid, and 0.70 g of ethyltriphenylphosphonium bromide were dissolved, and then the whole was reacted at 130° C. for 4 hours to give a polymer compound solution. The obtained polymer compound corresponded to Formula (4-3) and had a weight average molecular weight of 1,000 in terms of standard polystyrene. The obtained polymer contained a triazinetrione ring and a benzene ring at a total content of 55% by mass in terms of cyanuric acid and in terms of benzene ring, respectively.

Synthesis Example 7

A solution of 20.00 g of hydroxypropyl methacrylate dissolved in 60.8 g of propylene glycol monomethyl ether was heated to 80° C. To the solution, a solution of 0.20 g of azobisisobutyronitrile dissolved in 20 g of propylene glycol monomethyl ether was slowly added. After the completion of the addition, the whole was reacted for 24 hours at 80° C. to give a polymer compound solution. The obtained polymer compound was polyhydroxypropyl methacrylate and had a weight average molecular weight of 50,000 in terms of standard polystyrene. The obtained polymer contained neither an aromatic ring structure nor a hetero ring structure.

Example 1

In 10 g of a solution containing 2 g of the polymer compound obtained in Synthesis Example 1, 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Example 2

In 10 g of a solution containing 2 g of the polymer compound obtained in Synthesis Example 2, 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Example 3

In 10 g of a solution containing 2 g of the polymer compound obtained in Synthesis Example 3, 79.13 g of cyclohexanone, 16.35 g of propylene glycol monomethyl ether acetate, and 5.45 g of γ-butyrolactone were dissolved to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Example 4

In 10 g of a solution containing 2 g of the polymer compound obtained in Synthesis Example 4, 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Example 5

In 10 g of a solution containing 2 g of the polymer compound obtained in Synthesis Example 5, 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Example 6

In 10 g of a solution containing 2 g of the polymer compound obtained in Synthesis Example 6, 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Example 7

In 10 g of a solution containing 2 g of phenol novolac resin (manufactured by Asahi Organic Chemicals Industry Co., Ltd., trade name PAPS-PN4, corresponding to Formula (1-1), a number average molecular weight of 688, a weight average molecular weight of 1035, a degree of distribution Mw/Mn=1.50, a softening point of 111° C., a dimer content of 1.3% by mass), 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

Comparative Example 1

In 10 g of a solution containing 2 g of the polymer compound obtained in Synthesis Example 7, 0.5 g of tetramethoxymethyl glycoluril (manufactured by Nihon Cytec Industries Inc., trade name: Powderlink 1174) and 0.05 g of 5-sulfosalicylic acid were mixed. The mixture was dissolved in 79.47 g of propylene glycol monomethyl ether and 37.49 g of propylene glycol monomethyl ether acetate to prepare a solution. Then, the solution was filtrated through a polyethylene microfilter having a pore diameter of 0.10 µm and further filtrated through a polyethylene microfilter having a pore diameter of 0.05 µm to prepare a solution of a composition for forming a resist underlayer film.

[Dissolution Test into Resist Solvent]

Each composition for forming a resist underlayer film prepared in Example 1 to Example 6 of the present invention was applied (spin coated) onto a silicon wafer using a spinner. The coated silicon wafer was heated on a hot plate at 205° C. for 1 minute to form a resist underlayer film (a film thickness of 0.10 µm). Each resist underlayer film was immersed in ethyl lactate and propylene glycol monomethyl ether that are solvents for a resist solution to confirm that each resist underlayer film was insoluble in the solvents.

[Outgassing Amount Test]

Each solution of the compositions for forming a resist underlayer film prepared in Examples 1 to 7 and Comparative Example 1 was applied onto a silicon wafer using a spinner. The coated silicon wafer was heated on a hot plate at 205° C. for 1 minute to form a resist underlayer film (a film thickness of 0.03 µm). The film obtained from Example 1 contained a triazinetrione ring and a benzene ring at a total content of 54% by mass in terms of cyanuric acid and in terms of benzene ring, respectively; the film obtained from Example 2 contained a triazinetrione ring and a benzene ring at a total content of 21% by mass in terms of cyanuric acid and in terms of benzene ring, respectively; the film obtained from Example 3 contained a naphthalene ring at a content of 79% by mass in terms of naphthalene; the film obtained from Example 4 contained an anthracene ring at a content of 8% by mass in terms of anthracene; the film obtained from Example 5 contained a triazinetrione ring at a content of 48% by mass in terms of cyanuric acid; in Example 6 a triazinetrione ring and a benzene ring were contained at a total content of 44% by mass in terms of cyanuric acid and in terms of benzene ring, respectively; the film obtained from Example 7 contained a benzene ring at a content of 59% by mass in terms of benzene; and the film obtained from Comparative Example 1 contained neither an aromatic ring structure nor a hetero ring structure.

The amount of outgassing from each resist underlayer film was determined with a resist outgassing exposure (ROX) system. For the measurement, the pressure in the chamber was in a range from 1.0 to $8.0 \times 10^{-8}$, the exposure amount of EUV was 6.0 mJ/cm$^2$, and the amount of outgassing generated was determined with Quadropole MS. The outgassing was measured over a molecular weight ranging from 35 to 200 except 44.

The results of the amount of outgassing are shown in Table 1.

The results are shown in the number of molecule/cm²/s.

TABLE 1

|  | Outgassing amount |
| --- | --- |
| Example 1 | $1.17 \times 10^{13}$ |
| Example 2 | $1.17 \times 10^{13}$ |
| Example 3 | $1.51 \times 10^{13}$ |
| Example 4 | $1.23 \times 10^{13}$ |
| Example 5 | $1.01 \times 10^{13}$ |
| Example 6 | $1.54 \times 10^{13}$ |
| Example 7 | $1.60 \times 10^{13}$ |
| Comparative Example 1 | $1.17 \times 10^{14}$ |

The results of Examples and Comparative Example revealed that the film including an aromatic ring structure or a hetero ring structure generated a small amount of outgassing due to decomposition products caused by EUV exposure. It had been supposed that a film having a higher content of the aromatic ring structure or the hetero ring structure would achieve a higher effect. However, the compound used (a polymer or a polymer precursor) may form a three-dimensional structure in the film during curing, and therefore the content of the aromatic ring structure or the hetero ring structure in the film was not always proportional to the outgassing amount reduction effect. In order to achieve such effect, the film is required to include a fraction arising from the aromatic ring structure or the hetero ring structure at a content of 5% by mass or more, and in consideration of the solubility to a solvent, the content is preferably 90% by mass or less.

The resist underlayer film used in the present invention can improve adhesion to the resist, characteristics of resist shape, barrier performance for suppressing a passage of harmful substances between the underlayer (such as a substrate and an organic underlayer film) and the resist, thin film characteristics (for example 30 nm or less), and characteristics of etching speed, as well as can reduce the decomposition product gas (outgassing) that may be generated during the irradiation with ray energy radiation.

INDUSTRIAL APPLICABILITY

The composition can be applied onto a semiconductor substrate in a lithography process for producing a semiconductor device and can be used as an underlayer film of a high-energy radiation resist for preventing reflection, static electrification, and development defects and for suppressing outgassing during the exposure of a high-energy radiation resist layer.

The invention claimed is:

1. A method for producing a semiconductor device, the method comprising:
    forming an underlayer film by applying a composition onto a semiconductor substrate, and
    baking the substrate, wherein
        the underlayer film has a film thickness of 10 to 30 nm, and
        the composition comprises:
            an acid catalyst, and
            a film component, the film component being a compound having an aromatic ring structure, where the compound having an aromatic structure is a polymer or a polymer precursor including a repeating unit structure of Formula (1):

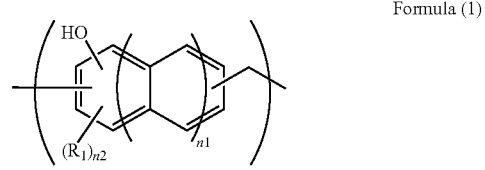

Formula (1)

where
    n1 is an integer of 0 to 2,
    n2 is an integer of 0 or more and an integer not more than a maximum number of substituents optionally substituted for a hydrogen atom on a corresponding ring,
    $R_1$ is an alkyl group, a halogen group, a nitro group, a cyano group, or an amino group, wherein
        the film component having an aromatic ring structure is contained in the underlayer film at a proportion of 5 to 85% by mass, and
        the polymer or a polymer precursor includes the repeating unit structure of Formula (1) including a dimer of the repeating unit structure of Formula (1) at a content of 10% by mass or less, and has a degree of distribution expressed by:
    weight average molecular weight Mw/number average molecular weight Mn of 3.00 or less;
    forming a resist layer on the underlayer film;
    exposing the resist formed as a layer on the underlayer film to an EUV; and
    developing the resist after the exposure.

* * * * *